(12) United States Patent
Mahadeswaramy et al.

(10) Patent No.: US 9,904,178 B2
(45) Date of Patent: Feb. 27, 2018

(54) ON-BOARD SUPPLY SYSTEM FOR A STAGE ASSEMBLY

(71) Applicant: NIKON CORPORATION, Tokyo (JP)

(72) Inventors: Chetan Mahadeswaramy, San Francisco, CA (US); Johnathan Marquez, San Diego, CA (US); Joseph P. Rossi, San Jose, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 15/094,480

(22) Filed: Apr. 8, 2016

(65) Prior Publication Data

US 2016/0299439 A1 Oct. 13, 2016

Related U.S. Application Data

(60) Provisional application No. 62/145,160, filed on Apr. 9, 2015, provisional application No. 62/168,333, filed on May 29, 2015.

(51) Int. Cl.
*G03F 7/20* (2006.01)
*H01L 21/67* (2006.01)

(52) U.S. Cl.
CPC ...... *G03F 7/70341* (2013.01); *G03F 7/70716* (2013.01); *G03F 7/70858* (2013.01); *G03F 7/70991* (2013.01); *H01L 21/67017* (2013.01); *H01L 21/67109* (2013.01)

(58) Field of Classification Search
CPC ............. G03F 7/70716; G03F 7/70858; G03F 7/70991; G03F 7/70875
See application file for complete search history.

(56) References Cited

U.S. PATENT DOCUMENTS 5,794,966 A * 8/1998 MacLeod ............. B60G 21/067
280/124.104
6,590,633 B1 * 7/2003 Nishi .................. G03F 7/70358
269/21

* cited by examiner

*Primary Examiner* — Steven H Whitesell Gordon
(74) *Attorney, Agent, or Firm* — Roeder & Broder LLP; Steven G. Roeder

(57) ABSTRACT

A stage assembly (10) that moves a device (15) includes a stage (14) that retains the device (15), a base (12), a stage mover assembly (16), and a supply system (20A). The supply system (20A) is secured to and positioned on the stage (14). The supply system (20A) includes a circulation system (24) that circulates a circulation fluid (22) through a circulation conduit (14D) in the stage (14) to control the temperature of the stage (14) and the device (15). The circulation system (24) can include a storage container assembly (234A) that defines a supply chamber (350) that supplies pressurized circulation fluid (22) to the circulation conduit (14D), a return chamber (352) that receives the circulation fluid (22) that was circulated through the circulation conduit (14D), a movable piston (354) that separates the supply chamber (350) from the return chamber (352), and a piston urger (356) that urges the piston (354) to move to reduce the supply volume of the supply chamber (350) and urge the circulation fluid (22) out of the supply chamber (350).

22 Claims, 10 Drawing Sheets

ON-BOARD SUPPLY SYSTEM FOR A STAGE ASSEMBLY

RELATED APPLICATION

This application claims priority on U.S. Provisional Application Ser. No. 62/145,160, filed on Apr. 9, 2015 and entitled "ON-BOARD SUPPLY SYSTEM FOR A STAGE ASSEMBLY"; and on U.S. Provisional Application Ser. No. 62/168,333, filed on May 29, 2015 and entitled "ON-BOARD SUPPLY SYSTEM FOR A STAGE ASSEMBLY". As far as permitted, the contents of U.S. Provisional Application Ser. Nos. 62/145,160 and 62/168,333 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images and the features within the images transferred onto the wafer from the reticle are extremely small. Accordingly, the precise relative positioning of the wafer and the reticle is critical to the manufacturing of high density, semiconductor wafers.

Unfortunately, during the exposure process, the temperature of the wafer can fluctuate (e.g. heat up from the illumination beam or cool down from evaporative cooling caused by evaporation of an immersion fluid above the wafer in an immersion lithography system). This can distort the wafer and reduce the accuracy of the images transferred to the wafer.

SUMMARY

The present invention is directed to a stage assembly that moves a device. The stage assembly includes a stage, a base, a stage mover assembly, and a supply system. The stage retains the device and includes a circulation conduit. The stage mover assembly moves the stage relative to the base. The supply system is secured to and positioned on the stage. In one embodiment, the supply system includes a circulation system that circulates a circulation fluid through the circulation conduit on the stage. With this design, the circulation system can be used to control the temperature of the stage and/or the device without external hoses/tubes that extend off of the stage to an off-board circulation system.

In one embodiment, the circulation system includes a storage container assembly that defines a supply chamber that supplies pressurized, circulation fluid to the circulation conduit, and a return chamber that receives the circulation fluid that was circulated through the circulation conduit. During operation of the circulation system, a supply volume of the supply chamber decreases and a return volume of the return chamber increases concurrently. More specifically, the storage container assembly can include a movable piston that separates the supply chamber from the return chamber, and a resilient member that urges the movable piston to move to reduce the supply volume of the supply chamber and urge the circulation fluid out of the supply chamber. With this design, the circulation fluid urged from the supply chamber by the movable piston and the resilient member, returns to the return chamber after circulating through the stage.

In one embodiment, the movable piston has approximately the same density as the circulation fluid. As a result thereof, a center of gravity of the stage does not shift as the movable piston moves.

Additionally, the circulation system can include a flow control assembly that selectively controls a flow rate of the circulation fluid from the supply chamber to the circulation conduit.

Further, the supply system can include a vacuum supply that supplies a vacuum to a chuck on the stage that retains the device, and a power source that provides electrical power to the stage.

Moreover, the stage assembly can include a recharging station which selectively recharges the circulation system, the vacuum supply, and the power source while the supply system is on the stage. Alternatively, the supply system can be removable from the stage and swappable to recharge the circulation system.

In another embodiment, the stage includes a coarse stage and a fine stage that is movable relative to the coarse stage. In this embodiment, the supply system can be secured to one of the fine stage and the coarse stage.

Additionally, the present invention is directed to a supply system that supplies pressurized, circulation fluid to a circulation conduit. The supply system can include (i) a first storage container assembly that defines a supply chamber that supplies a first portion of the circulation fluid to the circulation conduit, a return chamber that receives the first portion of the circulation fluid that was circulated through the circulation conduit, and a movable piston that separates the supply chamber from the return chamber; and (ii) a second storage container assembly that defines a supply chamber that supplies a second portion of the circulation fluid to the circulation conduit, a return chamber that receives the second portion of the circulation fluid that was circulated through the circulation conduit, and a movable piston that separates the supply chamber from the return chamber. In one embodiment, the movable piston of the first storage container assembly moves in an opposite direction from the movable piston of the second storage container assembly while the pressurized circulation fluid is supplied to the circulation conduit so that the center of gravity of the supply system remains at approximately the same location.

In certain embodiments, the first storage container assembly is stacked on top of the second storage container assembly. In this embodiment, the first storage container assembly includes a first container central axis and the second storage container assembly includes a second container central axis, and the first container central axis is aligned with the second container central axis and the center of gravity. Further, the center of gravity can be positioned between the first storage container assembly and the second storage container assembly. Alternatively, the first storage container assembly and the second storage container assembly can be positioned side-by-side.

The present invention is also directed to an exposure apparatus, a device manufactured with the exposure apparatus, and/or a wafer on which an image has been formed by the exposure apparatus. Further, the present invention is also directed to a method for moving a device, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
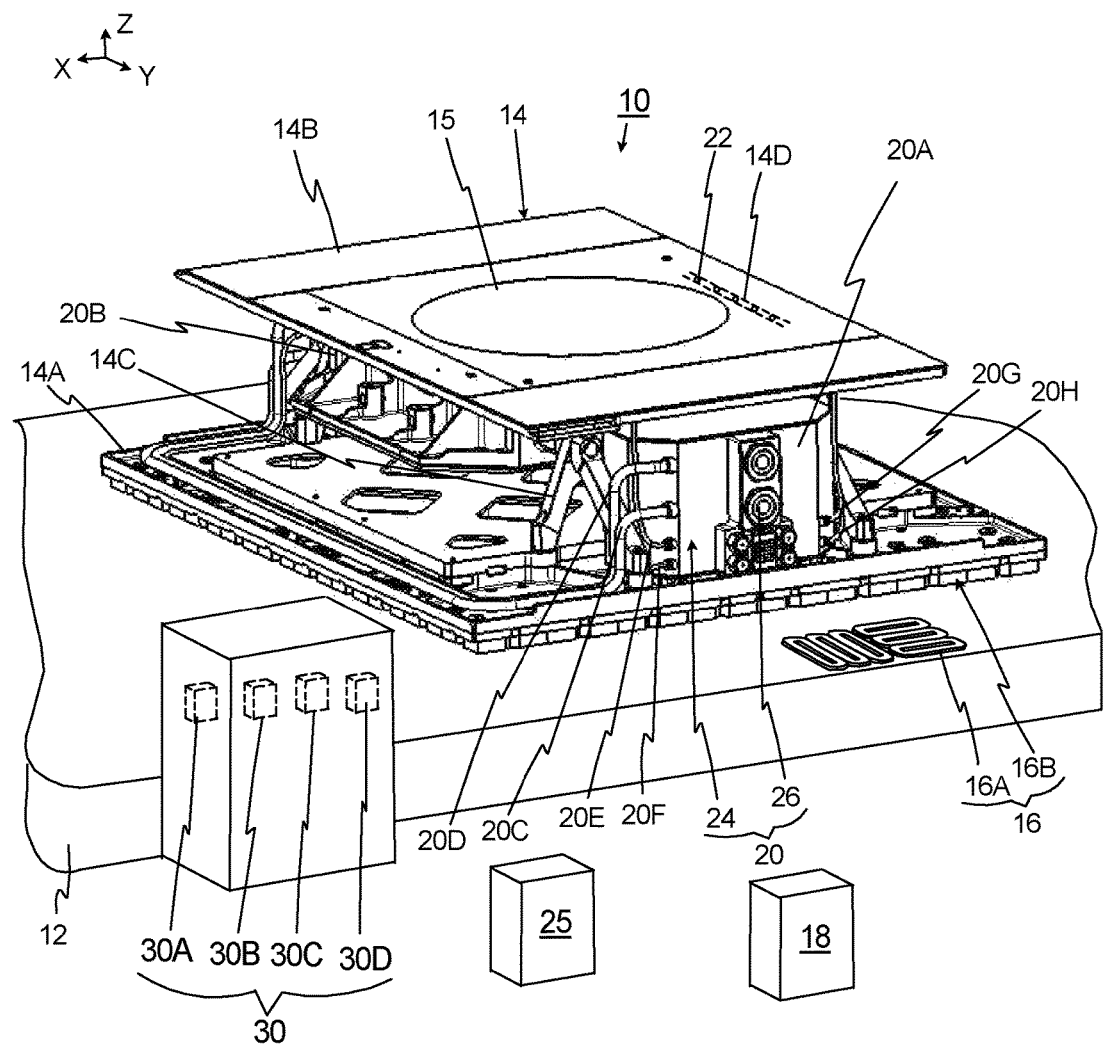
FIG. 1 is a perspective view of a first embodiment of a stage assembly having features of the present invention.

Referring initially to FIG. 1, a stage assembly 10 having features of the present invention includes a base 12, a stage 14 that retains a device 15 (also referred to as a "workpiece"), a stage mover assembly 16 that moves the stage 14, a control system 18, and a supply system assembly 20. The design of each of these components can be varied to suit the design requirements of the stage assembly 10.

A number of alternative embodiments of the stage assembly 10 are provided herein. In certain embodiments, the supply system assembly 20 is on-board the stage 14, and uniquely designed to provide a circulation fluid 22 (illustrated as small circles) to the stage 14 with a circulation system 24 that is secured to, positioned on, and moves with the stage 14. As a result thereof, the circulation system 24 can be used to control the temperature of the stage 14 and/or the device 15 without external hoses/tubes that extend off of the stage 14 to an off-board circulation system 25 (illustrated as a box). As provided herein, the external hoseless stage 14 has the advantage of not being affected by disturbances and non-repeatable forces caused by the tubes attached between the stage 14 and the off-board circulation system 25 during movement of the stage 14. Moreover, the supply system assembly 20 can have a fixed center of gravity.

Further, in certain embodiments, the supply system assembly 20 can include a power source 26 that provides power to the stage 14, and a vacuum source 28 (illustrated in FIG. 3A) that provides a vacuum to a chuck on the stage 14 that selectively secures the device 15 to the stage 14. In this embodiment, the power source 26 and the vacuum source 28 are secured to and move with the stage 14. As a result thereof, (i) the power source 26 can provide power without external wires that extend off of the stage 14 to the control system 18, and (ii) the vacuum source 28 can provide a vacuum without external hoses/tubes that extend off of the stage 14. The external wireless/hoseless stage 14 has the advantage of not being affected by disturbances and non-repeatable forces caused by the wires/tubes attached between the stage 14 and the off-board components during movement of the stage 14

Additionally, the stage assembly 10 can include a recharging station 30 that provides a system to quickly recharge and resupply the circulation system 24, the power source 26, and vacuum source 28.

Some of the Figures provided herein include an orientation system that designates the X axis, the Y axis, and a Z axis that are orthogonal to each other. In these Figures, the Z axis is oriented in the vertical direction. It should be understood that the orientation system is merely for reference and can be varied. For example, the X axis can be switched with the Y axis and/or the stage assembly 10 can be rotated. Moreover, these axes can alternatively be referred to as the first, the second, or a third axis. For example, the X axis can be referred to as the first axis, the Y axis can be referred to as the second axis, and the Z axis can be referred to as the third axis.

The stage assembly 10 is particularly useful for precisely positioning the device 15 during a manufacturing and/or an inspection process. The type of device 15 positioned and moved by the stage assembly 10 can be varied. For example, the device 15 can be a semiconductor wafer, and the stage assembly 10 can be used as part of an exposure apparatus for precisely positioning the semiconductor wafer during manufacturing of the semiconductor wafer (semiconductor device). Alternatively, for example, the stage assembly 10 can be used to move other types of devices during manufacturing and/or inspection, to move a device under an electron microscope (not shown), or to move a device during a precision measurement operation (not shown).

The base 12 is coupled to the stage mover assembly 16, receives the reaction forces generated by the stage mover assembly 16, and can be any suitable structure. In FIG. 1, the base 12 is generally rectangular-shaped and is rigid. In certain embodiments, the base 12 can be a reaction assembly that counteracts, reduces and minimizes the influence of the reaction forces from the stage mover assembly 16 on the position of other structures on the exposure apparatus. For example, the base 12 can be a rigid, rectangular-shaped countermass that is maintained above a countermass support (not shown) with a reaction bearing (not shown) that allows for motion of the base 12 relative to the countermass support along the X axis, along the Y axis, and about the Z axis. For example, the reaction bearing can be a vacuum preload type fluid bearing, a magnetic type bearing, or a roller bearing type assembly. Alternatively, for example, the stage assembly 10 can include a reaction frame (not shown) that couples the base 12 to another structure.

With the present design, (i) movement of the stage 14 with the stage mover assembly 16 along the X axis, generates an equal and opposite X reaction force that moves the base 12 in the opposite direction along the X axis; (ii) movement of the stage 14 with the stage mover assembly 16 along the Y axis, generates an equal and opposite Y reaction force that moves the base 12 in the opposite direction along the Y axis; (iii) movement of the stage 14 with the stage mover assembly 16 about the Z axis generates an equal and opposite theta Z reaction moment (torque) that moves the base 12 about the Z axis; and (iv) depending on the position of stage 14, movement of the stage 14 with the stage mover assembly 16 along the X axis or along the Y axis may generate a theta Z reaction moment (torque) that moves the base 12 about the Z axis.

In one embodiment, the stage assembly 10 includes a single stage 14 that is moved relative to the stage base 12. Alternately, for example, the stage assembly 10 can be designed to include multiple stages that are independently moved relative to the stage base 12.

In FIG. 1, the stage 14 retains the device 15. The design of the stage 14 can be varied greatly to suit the design requirements of the stage 14. In the non-exclusive embodiment illustrated in FIG. 1, the stage 14 is monolithic and includes (i) a generally rectangular-shaped, lower section 14A; (ii) a generally rectangular-shaped, upper section 14B (also sometimes referred to as a "device table") that is substantially parallel to, and positioned above the lower section 14A; and (iii) a rigid connector assembly 14C that fixedly connects the upper section 14B to the lower section 14A with the sections 14A, 14B spaced apart. In this embodiment, the upper section 14B includes a device holder (not shown) for retaining the device 15. The device holder can be a vacuum chuck, an electrostatic chuck, or some other type of clamp.

Further, in this embodiment, the upper section 14B includes a circulation conduit 14D (only a portion is illustrated in phantom and also referred to as a "heat exchanger") for receiving the circulation fluid 22 for controlling the temperature of the upper section 14B and/or the device 15. As a non-exclusive example, the circulation conduit 14D can include a plurality of microchannels (e.g. a series of fluid channels) that are formed in or positioned on the upper section 14B. The circulation conduit 14D can be near, adjacent to, and/or under the device 15.

The stage mover assembly 16 controls and adjusts the position of the stage 14 and the device 15 relative to the stage base 12. For example, the stage mover assembly 16 can move and position of the stage 14 with six degrees of freedom, e.g. along the X, Y, and Z axes, and about the X, Y, and Z axes, relative to the base 12. Alternatively, the stage mover assembly 16 can be designed to move the stage 14 with less than six degrees of freedom, e.g. with three degrees of freedom. As provided herein, the stage mover assembly 16 can include one or more planar motor, linear motors, voice coil motors, attraction only actuators, and/or other types of actuators.

In FIG. 1, the stage mover assembly 16 is a planar motor that moves and positions the stage 14 with six degrees of freedom. In this embodiment, the stage mover assembly 16 includes a conductor assembly 16A (only a portion is illustrated in FIG. 1), and a magnet assembly 16B positioned adjacent to the conductor assembly 16A. Moreover, one of the assemblies 16A, 16B is secured to the stage 14 and the other of the assemblies 16B, 16A is secured to the base 12. In FIG. 1, the conductor assembly 16A is secured to the base 12 and the magnet assembly 16B is secured to the stage 14.

In this embodiment, the conductor assembly 16A includes a plurality of X conductor units and a plurality of Y conductor units that are arranged in an alternating fashion along the X axis and along the Y axis to create a checkerboard pattern. Further, in certain embodiments, all of the conductor units are attached to the top of the base 12, are in substantially the same plane and have the same Z axis position. Moreover, each of the conductor units can include a plurality of conductors, e.g. three conductors. With this design, the conductors 32, 36 are organized in a two-dimensional planar array.

The magnet assembly 16B includes a plurality of magnets that are attached to the bottom of the stage 14, that are in substantially the same plane and have substantially the same Z axis position. In one non-exclusive embodiment, the plurality of magnets are configured in a somewhat checkerboard pattern in which adjacent magnets have a different polarity (e.g. alternate between the south pole facing the conductor assembly 16A and the north pole facing the conductor assembly 16A). As one non-exclusive example, each magnet can be made of a permanent magnetic material such as NdFeB. Further, each magnet can be generally rectangular, long and narrow.

The electrical current supplied to the conductor assembly 16A also generates heat, due to resistance in the conductor assembly 16A. In FIG. 1, the heat from the conductor assembly 16A is subsequently transferred to the base 12. This can cause expansion and distortion of the base 12. Further, the heat from the conductor assembly 16A can be transferred to the surrounding environment, including the air surrounding the conductor assembly 16A. This can adversely influence a measurement system (not shown) that measures the position of the stage 14 and the device 15. For example, certain measurement systems utilize one or more interferometers. The heat from the conductor assembly changes the index of refraction of the surrounding air. This reduces the accuracy of the measurement system and degrades machine positioning accuracy.

In the embodiment illustrated in FIG. 1, the off-board circulation system 25 can be used to circulate a fluid (not shown) through the base 12 and/or adjacent to or around the conductor assembly 16A. With this design, the off-board circulation system 25 can be used to reduce the influence of the heat from the conductor assembly 16A from adversely influencing the other components of the stage assembly 10 and the surrounding environment.

The control system 18 is electrically connected and directs and controls (i) electrical current to the conductor assembly 16A of the stage mover assembly 16 to precisely position the device 15, (ii) the off-board circulation system 25 to control the temperature of the conductor assembly 16A, and (iii) the recharging station 30 to selectively recharge the supply system assembly 20. The control system 18 can include one or more processors.

In one embodiment, the supply system assembly 20 includes a first supply system 20A and a second supply system 20B that is spaced apart from the first supply system 20A. In this embodiment, the supply systems 20A, 20B (i) are on-board and are fixedly secured to the top of the lower section 14A of the stage 14, (ii) move concurrently with the stage 14, and (iii) are spaced apart on either side of the upper section 14B to balance out and maintain a center of gravity of the stage 14 at a center of the stage 14. Alternatively, the supply system assembly 20 can be designed to include more than two or just one supply system.

In one, non-exclusive embodiment, each of the supply systems 20A, 20B can include (i) the circulation system 24 that directs the circulation fluid 22 to the circulation conduit 14D of the stage 14; (ii) the power source 26 that provides power to the stage 14, and (iii) the vacuum source 28 that provides a vacuum for a chuck that selectively secures the device 15 to the stage 14.

Further, each of supply systems 20A, 20B can also include (i) a fluid supply tube 20C that connects the circulation system 24 to an inlet of the circulation conduit 14D; (ii) a fluid return tube 20D that connects the circulation system 24 to an outlet of the circulation conduit 14D; (iii) a vacuum supply tube 20E that connects the vacuum source 28 to the vacuum chuck; (iv) a vacuum return tube 20F that connects the vacuum chuck to the vacuum source 28; (v) a pressure supply tube 20G that is in fluid communication with a three prong device used to lift the device 15 off of the chuck; (vi) a pressure return tube 20H that is in fluid communication with the three-prong device (not shown) used to lift the device 15 off of the chuck; (vii) one or more electrical wires (not shown) that electrically connect the power source 26 to the electrical component(s) on the stage 14.

Additionally, the stage assembly 10 can include one or more recharging stations 30 (only one is shown) that provides a way to quickly recharge and resupply the circulation system 24, the power source 26, and the vacuum source 28. In one embodiment, the recharging station 30 is positioned near the base 12 and the stage mover assembly 16 moves the stage 14 until the first supply system 20A engages and automatically connects to the recharging station 30 for resupplying the circulation system 24, the power source 26, and the vacuum source 28 of the first supply system 20A. Subsequently, the stage mover assembly 16 can move the stage 14 until the second supply system 20B engages and automatically connects to the recharging station 30 for resupplying the circulation system 24, the power source 26, and the vacuum source 28 of the second supply system 20B. Alternatively, the supply systems 20A, 20B can be connected so that recharging station 30 can recharge both supply systems 20A, 20B when only one of the supply systems 20A, 20B is engaging the recharging station 30.

In one embodiment, recharging station 30 includes (i) a recharge fluid system 30A for recharging the circulation system 24; (ii) a recharge vacuum system 30B for recharging the vacuum source 28; (iii) a recharge, pressurized fluid system 30C for providing pressurized fluid for the three-prong device used to lift the device 15 off of the chuck; and (iv) a recharge power source 30D that recharges the power source 26.

In one embodiment, the recharging station 30 and one or both supply systems 20A, 20B include interfaces that allow for quick and automatic connections (coupling), and rapid recharging. In certain embodiments, in order to not adversely influence throughput, the recharging must be very fast. For example, the docking and recharging can be done between (i) the measurement and alignment process and (ii) the exposure process.

Figure 2:
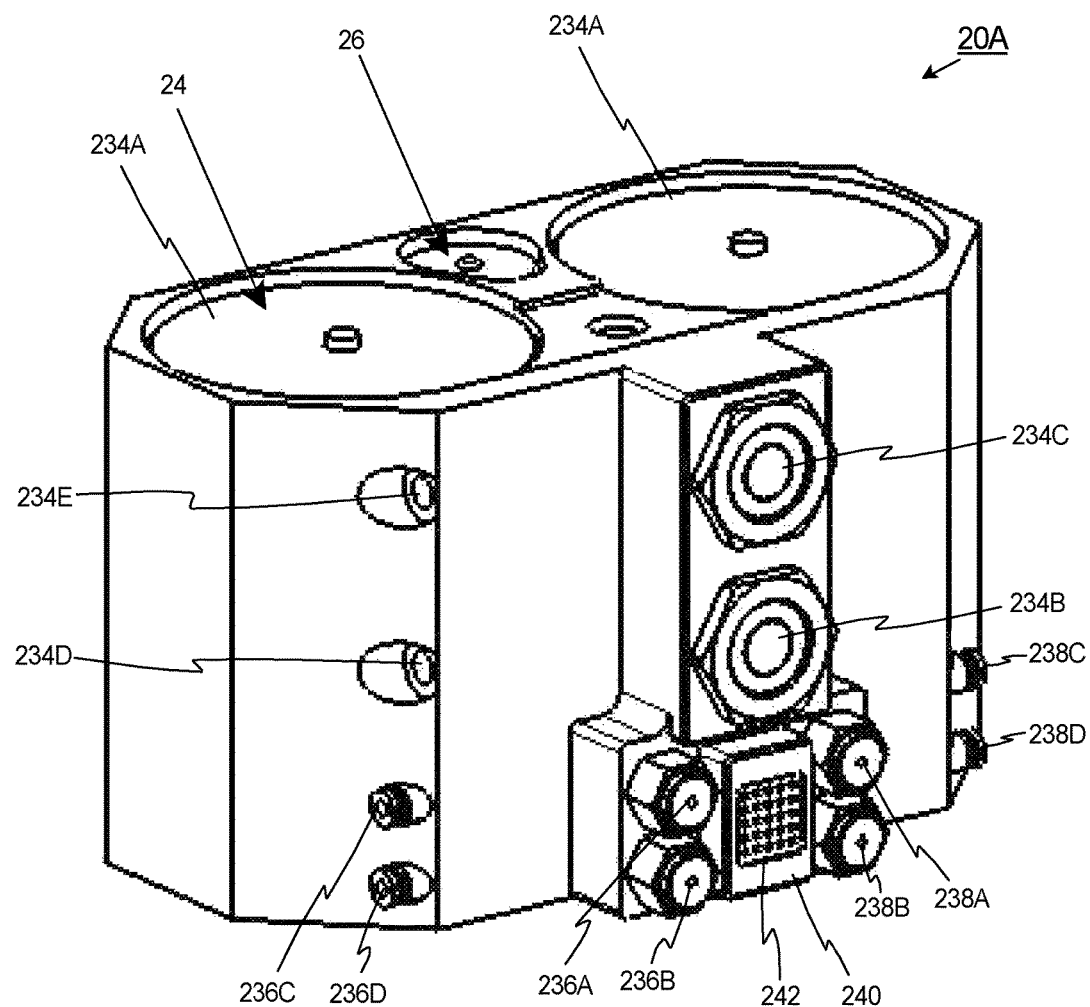
FIG. 2 is a perspective view of one embodiment of a supply system having features of the present invention.

FIG. 2 is a perspective view of the supply system 20A including (i) the circulation system 24; and (ii) the power source 26. The vacuum source 28 is not visible in FIG. 2. In this embodiment, the circulation system 24 includes (i) two storage container assemblies 234A that are positioned side-by-side; (ii) a circulation inlet 234B in fluid communication with the storage assemblies 234A, (iii) a circulation outlet 234C in fluid communication with the storage assemblies 234A; (iv) a circulation supply port 234D in fluid communication with the storage assemblies 234A and the circulation inlet to the circulation conduit 14D; and (v) a circulation return port 234E in fluid communication with the storage assemblies 234A and the circulation outlet of the circulation conduit 14D. Alternatively, the circulation system 24 can include more than two or only one storage container. In one non-exclusive embodiment, the circulation inlet 234B and the circulation outlet 234C are each female quick connect components that are adapted to receive a corresponding male quick connect component (not shown) on the recharging station 30. This design allows for the rapid refilling of the storage assemblies 234A with fresh circulation fluid 22.

Further, the vacuum source 28 includes (i) a vacuum inlet 236A and a vacuum outlet 236B which are in fluid communication with a vacuum tank (not shown in FIG. 2) and which are adapted to receive corresponding components on the recharging station 30; (ii) a vacuum supply port 236C in fluid communication with the vacuum tank and the vacuum chuck; and (iii) a vacuum return port 236D in fluid communication with the vacuum tank and the vacuum chuck. With this design, when docked, the recharging station 30 can be used to generate a vacuum in the vacuum tank.

Moreover, the pressure source includes (i) a pressure inlet 238A and a pressure outlet 238B which are adapted to receive corresponding components on the recharging station 30 (ii) a pressure supply port 238C in fluid communication with the pressure inlet 238A and the three-prong device on the chuck; and (iii) a pressure return port 238D in fluid communication with the pressure outlet 238B and three-prong device on the chuck. With this design, when docked, the recharging station 30 can be used to provide pressurized fluid used to activate the three-prong device to lift the device 15 off of the chuck.

Still further, the supply system 20A includes a controller 240 (with storage) and an electrical connector 242 that is adapted to receive a corresponding component on the recharging station 30. In this embodiment, the controller 240 can be used to control one or more components on the stage 14 (illustrated in FIG. 1), and can store information from the stage. Further, the electrical connector 242 allows for the transfer of information between the controller 240 and the control system 18 (illustrated in FIG. 1), and allows for the recharging of the power source 26. As a non-exclusive example, the power source 26 can include one or more super-capacitors.

Figure 3A:
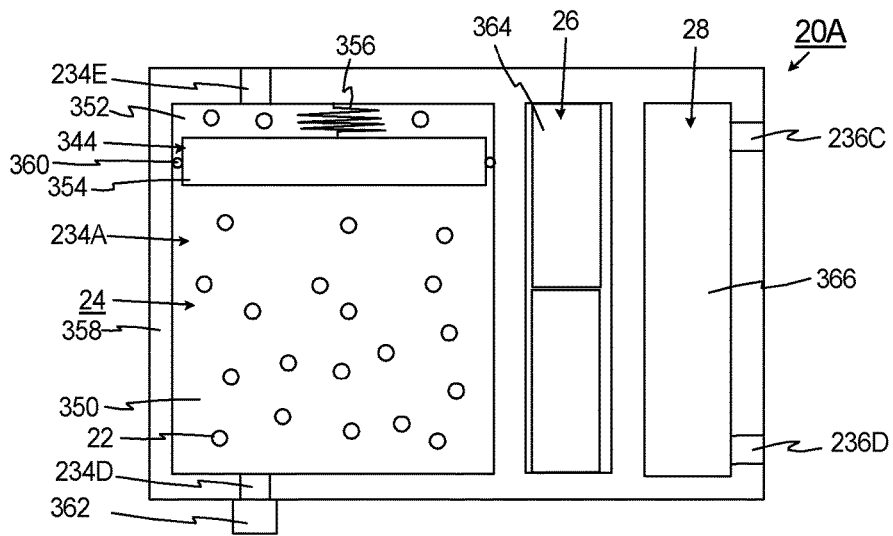
FIGS. 3A, 3B, and 3C are simplified illustrations of a portion of the circulation system at alternative positions.
Figure 3B:
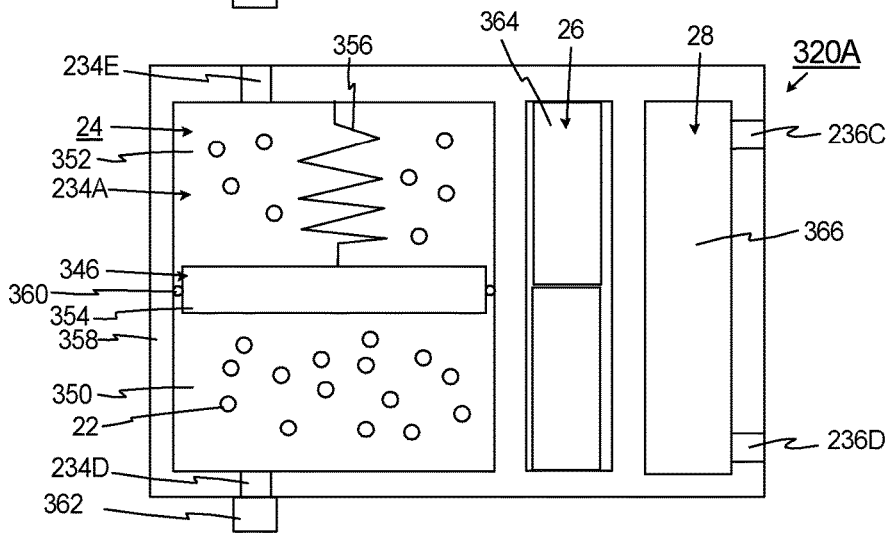
Figure 3C:
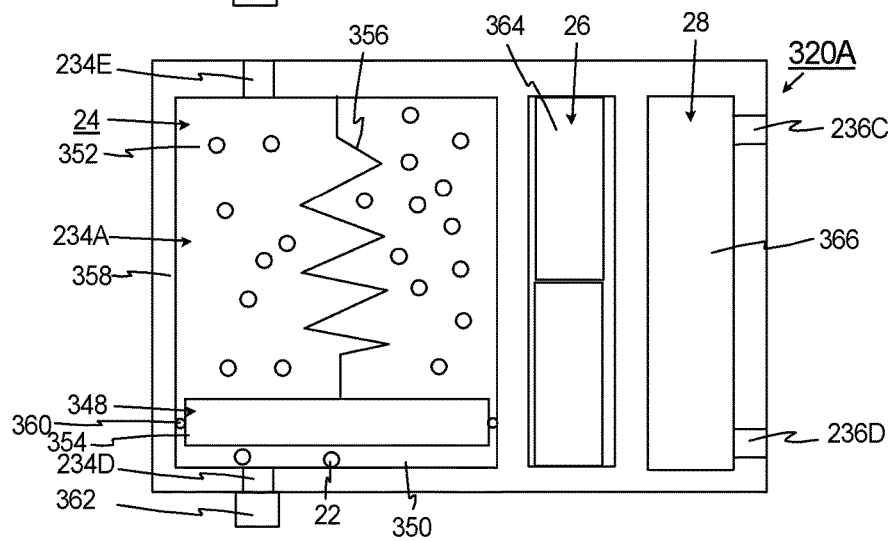

FIGS. 3A, 3B, 3C are simplified, cross-sectional, illustrations of a supply system 20A including the circulation system 24, the power source 26, and the vacuum source 28. In this example, the circulation system 24 includes a single storage container assembly 234A, which is illustrated at a full position 344 in FIG. 3A, at a half-full position 346 in FIG. 3B, and at an empty position 348 in FIG. 3C. Additionally, in this embodiment, the one storage container assembly 234A includes the supply port 234D that is in fluid communication with the inlet to the circulation conduit 14D (illustrated in FIG. 1); and the return port 234E that is in fluid communication with the outlet of the circulation conduit 14D.

In this embodiment, the storage container assembly 234A defines a supply chamber 350 that supplies pressurized circulation fluid 22 to the circulation conduit 14D, and a return chamber 352 that receives the circulation fluid 22 that was circulated through the circulation conduit 14D. In one embodiment, the storage container assembly 234A includes a movable piston 354 (or barrier) that separates the supply chamber 350 from the return chamber 352, and a piston urger 356 that urges the piston 354 to move to reduce the supply volume of the supply chamber 350 and urge the circulation fluid 22 out of the supply chamber 350. Thus, the piston 354 and the piston urger 356 act as a pump that creates a pressure used to circulate the fluid 22 through the circulation conduit 14D. With this design, during operation of the circulation system 24, a supply volume of the supply chamber 350 decreases and a return volume of the return chamber 352 increases concurrently. As non-exclusive examples, the piston urger 356 can be a resilient member, such as a spring or other type of device such as fluid bladder.

In one embodiment, the storage container assembly 234A includes a wall 358 that defines a cylindrical-shaped opening, and the piston 354 is generally cylindrical-shaped and slides in the cylindrical-shaped opening. Further, the piston 354 can include a piston seal 360 that seals the side of the piston 354 to the wall 358. However, other shapes and designs can be utilized.

In one non-exclusive embodiment, the piston 354 has approximately the same density as the circulation fluid 22 to inhibit the shifting of the center of gravity of the assembly during operation. Alternatively, if the piston 354 has a different density than the circulation fluid, two storage container assemblies 234A can be used with the chambers 350, 352 flipped (one assembly has return chamber on top and supply chamber on bottom and other assembly has supply chamber on top and return chamber on bottom) to inhibit the shifting of the center of gravity. Still alternatively, multiple storage containers (for example 2 or more) can be arranged in such a way that center of gravity does not change significantly by positioning, orienting the chambers as well as selecting the direction of motion of the pistons.

It should be noted that the orientation of the supply chamber 350 and the return chamber 352 can be different than that illustrated in FIGS. 3A-3C (e.g. rotated 90 or 180 degrees), and/or multiple storage container assemblies 234A can be utilized.

Additionally, the circulation system 24 can include a flow control assembly 362 that selectively controls a flow rate of the circulation fluid 22 from the supply chamber 350 to the circulation conduit 14D. With this design, the flow control assembly 362 can selectively adjust a flow rate of the circulation fluid 22 that is directed to the circulation conduit 14D to maintain the desired temperature of the device 15. For example, the flow control assembly 362 can include one or more valves which are controlled by electrical actuators powered by the power source 26. In this embodiment, the flow control assembly 362 is positioned near the supply port 234D. It should be noted that the flow control assembly 362 can be positioned at another location, e.g. near the return port 234E or near the stage 14.

In one non-exclusive embodiment, the stage 14 can include one or more temperature sensors (not shown) that provide feedback regarding the temperature near the device 15. Using the feedback, the flow control assembly 362 can selectively control the flow rate of the circulation fluid 22 from the supply chamber 350 to the circulation conduit 14D to achieve and maintain the desired temperature of the device 15. Alternatively, without using feedback, the flow control assembly 362 can just fully or partly open the valve and allow for constant fluid flow during the exposure process.

As provided herein, the stored circulation fluid 22 can be pumped (via the piston 354 and piston urger 356) through the circulation conduit 14D to maintain a constant temperature (or maintain a desired temperature) of the stage 14 and/or the device 15, and the return circulation fluid 22 is stored on the stage 14 as well. Further, the storage container assembly 234A with the spring-loaded piston 354 for pumping the circulation fluid 22 also saves space by making use of the same volume for both supply and return circulation fluid 22.

Moreover, the pump does not need any other energy source other than the potential energy in the compressed spring 356. Further, when the circulation fluid 22 is exhausted, the spring 356 can be re-compressed while refilling the supply chamber 350 with pressurized circulation fluid 22 with the recharging station 30. This pump is lightweight and vibration-free compared to other electrical alternatives with motors. Further, this design is passive after being recharged. The piston of the pump keeps the circulation fluid 22 completely confined between the surface of the piston 354 and the tank walls 358 without enclosing any air (or minimizing the amount of air). The spring-loaded partition inhibits the circulation fluid 22 from sloshing within the chambers 350, 352 when the stage 14 is accelerated or decelerated. Further, the piston 354 also conveniently separates the circulation fluid 22 into two distinct volumes that can be used for supply and return circulation fluid 22. While the volume that is occupied by the supply circulation fluid 22 decreases, the volume on the other side of the piston 354 increases and can be made use of for return circulation fluid 22.

As provided above, FIG. 3A illustrates the storage container assembly 234A at the full position 344. At this time, the flow control assembly 362 inhibits flow of the circulation fluid 22 to the circulation conduit 14D, the recharging station 30 has filled the supply chamber 350 with fresh circulation fluid 22 at the appropriate temperature via the circulation inlet 234B (illustrated in FIG. 2) while removing any used circulation fluid 22 from the return chamber 352 via the circulation outlet 234C (illustrated in FIG. 2). During this process, in this embodiment, the piston 354 has been moved upward against the urging of the piston urger 356 (spring is compressed). At this time, the supply volume of the supply chamber 350 is much larger than the return volume of the return chamber 352.

Next, at the appropriate time, (e.g. just prior to or at the start of the exposure process), the flow control assembly 362 opens to allow for flow of the circulation fluid 22 to the circulation conduit 14D. At this time, the piston urger 356 urges the piston 354 (downward in the illustrated example) to force the circulation fluid 22 from the supply chamber 350 thereby simultaneously reducing the supply volume of the supply chamber 350 while increasing the return volume of the return chamber 352. This causes the circulation fluid 22 to flow from the supply chamber 350 to the circulation conduit 14D and the used circulation fluid 22 to flow from the circulation conduit 14D to the return chamber 352.

As provided above, FIG. 3B illustrates the storage container assembly 234A at the half-full position 346 during the circulation process. At this time, the piston urger 356 is still urging the piston 354 (downward in the illustrated example) to force the circulation fluid 22 from the supply chamber 350 thereby simultaneously reducing the supply volume of the supply chamber 350 while simultaneously increasing the return volume of the return chamber 352.

As provided above, FIG. 3C illustrates the storage container assembly 234A at the empty position 348 (or approximately empty) at, near or after the end of the exposure process. At this time, the flow control assembly 362 inhibits flow of the circulation fluid 22 to the circulation conduit 14D, the piston 354 has moved downward, the supply volume of the supply chamber 350 is much smaller than the return volume of the return chamber 352, and the supply chamber 350 is almost empty while the return chamber 352 is full of the used circulation fluid 22.

In certain embodiments, the maximum supply volume at full position is approximately equal to the maximum return volume at the empty position, and the minimum return volume at full position is approximately equal to the minimum supply volume at the empty position.

As a result of the present design, the circulation system 24 can be used to control the temperature of the stage 14 and/or the device 15 without external hoses/tubes that extend off of the stage 14 to the off-board circulation system 25 (illustrated in FIG. 1). Further, the circulation system 24 is a closed-circuit design in which the circulation fluid 22 is pushed out of the supply chamber 350 into the circulation conduit 14D and subsequently returns to the return chamber 352. Stated in another fashion, as the circulation fluid 22 is used, supply volume of the supply chamber 350 is reduced and the return volume of the return chamber 352 is increased thereby not allowing for room for the circulation fluid 22 to slosh around in either chamber 350, 352. Accordingly, the circulation fluid 22 is always confined to inhibit disturbances caused by sloshing circulation fluid 22.

Thus, in one embodiment, the problem of pumping water into heat exchangers 14D on the stage 14 is solved by using a spring-loaded pump which also acts as an anti-slosh device and allows the same volume in the tank to be used for both supply and exhaust water.

It should be noted that the storage container assembly 234A can be appropriately insulated to maintain the temperature of the circulation fluid 22 in the chambers 350, 352.

The amount of circulation fluid 22 required to maintain the desired temperature of the stage 14 and device will depend on their designs and the exposure time and other factors. As a non-exclusive example, approximately one liter of circulation fluid 22 per every twenty seconds is required. The storage container assemblies 234A can be appropriately sized.

In FIGS. 3A-3C, the power source 26 includes a pair of power storage devices 364, e.g. super-capacitors. Alternatively, the power source 26 can have a different design. It should be noted that the super-capacitors 364 can be recharged at the recharging station 30 during docking via the electrical connector 242 (illustrated in FIG. 2).

Further, the vacuum source 28 is illustrated in FIGS. 3A-3C. In this embodiment, the vacuum source 28 includes a vacuum tank 366 that is subjected to a vacuum at the recharging station 30 via the vacuum inlet 236A (illustrated in FIG. 2) and the vacuum outlet 236B (illustrated in FIG. 2). Further, the vacuum source 28 includes the supply port 236C and the return port 236D which are in fluid communication with the chuck.

Figure 4A:
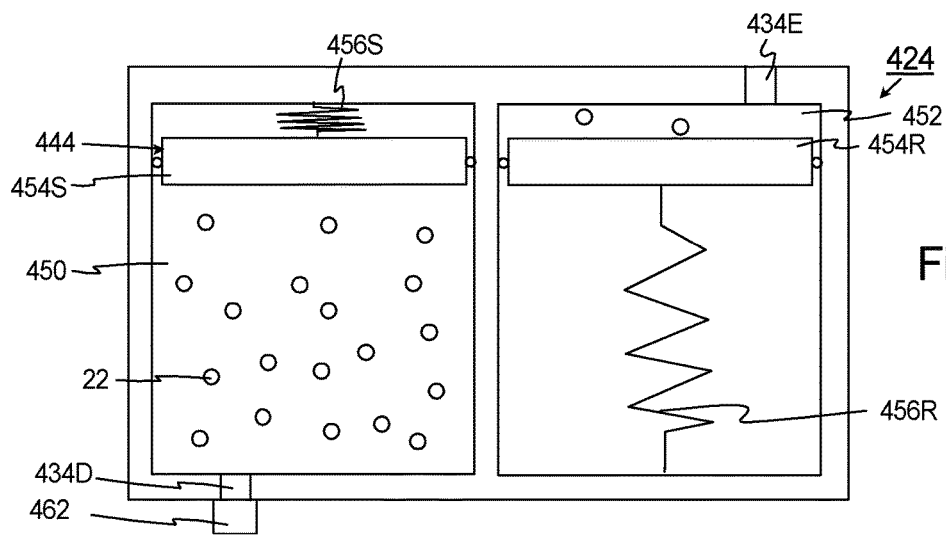
FIGS. 4A, 4B, and 4C are simplified illustrations of another embodiment of a portion of the circulation system at alternative positions.
Figure 4B:
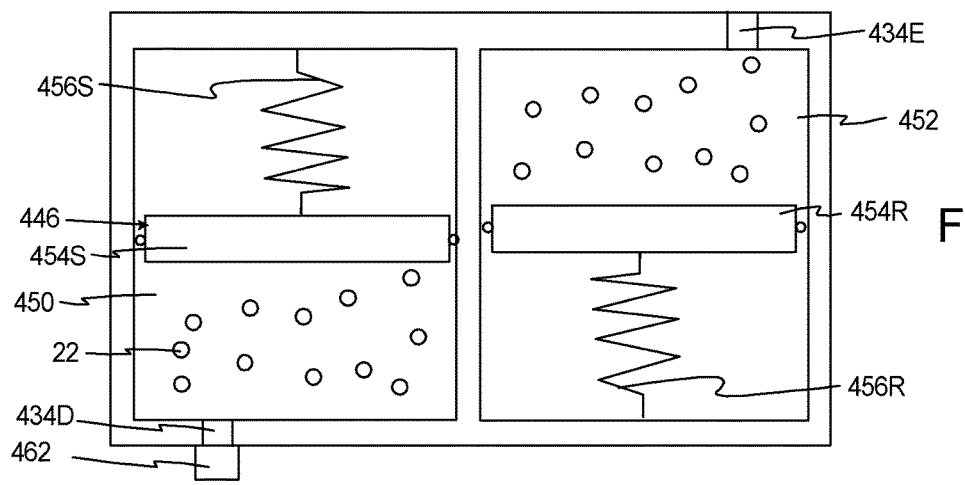
Figure 4C:
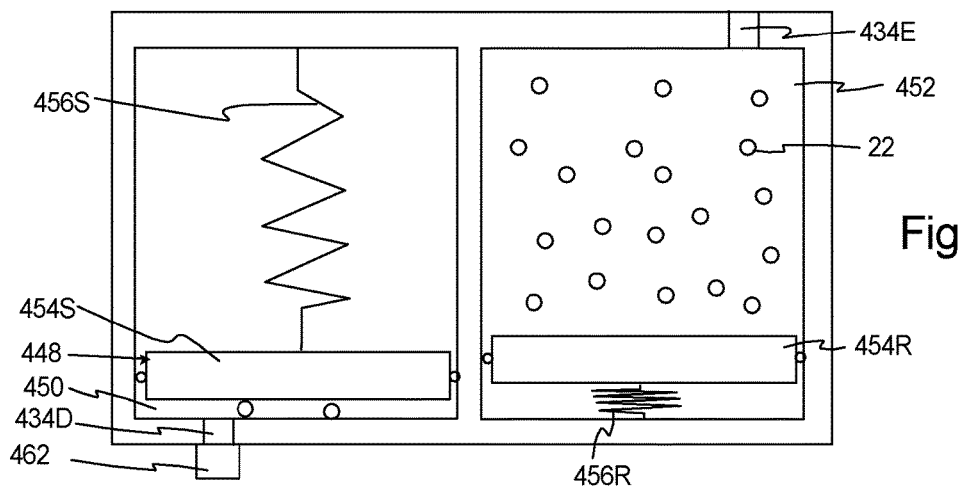

FIGS. 4A, 4B, 4C are simplified, cross-sectional, illustrations of another embodiment of a circulation system 424. In this embodiment, the supply chamber 450 and the return chamber 452 do not share the same volume. More specifically, in this embodiment, the supply chamber 450 includes a supply piston 454S and a supply piston urger 456S, and the return chamber 452 includes a return piston 454R and a return piston urger 456R. In this embodiment, the supply chamber 450 supplies pressurized circulation fluid 22 to the circulation conduit 14D (illustrated in FIG. 1), and the return chamber 452 receives the circulation fluid 22 that was circulated through the circulation conduit 14D. Further, in this example, the supply piston urger 456S is stronger than the return piston urger 456R. It is possible to not have a return piston 454R at all; rather just an empty tank for return with means for evacuating the air out when water occupies the air volume in the return chamber.

In this example, the circulation system 424 is illustrated at a full position 444 in FIG. 4A, at a half-full position 446 in FIG. 4B, and at an empty position 448 in FIG. 4C. Additionally, in this embodiment, the supply chamber 450 includes the supply port 434D that is in fluid communication with the inlet to the circulation conduit 14D (illustrated in FIG. 1); and the return chamber 452 includes the return port 434E that is in fluid communication with the outlet of the circulation conduit 14D. It should be noted that the orientation of the supply chamber 450 and the return chamber 452 can be different than that illustrated in FIGS. 4A-4C (e.g. rotated 90 or 180 degrees).

As provided above, FIG. 4A illustrates the circulation system 424 at the full position 444. At this time, the flow control assembly 462 inhibits flow of the circulation fluid 22 to the circulation conduit 14D, the recharging station 30 (illustrated in FIG. 1) has filled the supply chamber 450 with fresh circulation fluid 22 at the appropriate temperature while removing any used circulation fluid 22 from the return chamber 452. During this process, in this embodiment, the supply piston 454S has been moved upward against the urging of the supply piston urger 456S (spring is compressed) and at this time, the return piston 454R has been moved upward via the urging of the return piston urger 456R.

Next, at the appropriate time, the flow control assembly 462 opens to allow for flow of the circulation fluid 22 to the circulation conduit 14D. At this time, the supply piston urger 456S urges the supply piston 454S (downward in the illustrated example) to force the circulation fluid 22 from the supply chamber 450 thereby simultaneously reducing the supply volume of the supply chamber 450. This causes the circulation fluid 22 to flow from the supply chamber 450 to the circulation conduit 14D, and the used circulation fluid 22 to flow from the circulation conduit 14D to the return chamber 452. This causes the return piston 454R to move (downward in this example) against the urging of the return piston urger 456R, and the increase in return volume of the return chamber 452.

As provided above, FIG. 4B illustrates the circulation system 424 at the half-full position 446 during the circulation process. At this time, the supply piston urger 456S is still urging the supply piston 454S to force the circulation fluid 22 from the supply chamber 450 thereby simultaneously reducing the supply volume of the supply chamber 450 while simultaneously increasing the return volume of the return chamber 452.

FIG. 4C illustrates the circulation system 424 at the empty position 448 where the flow control assembly 462 inhibits flow of the circulation fluid 22 to the circulation conduit 14D, the pistons 454S, 454R have moved downward, the supply volume of the supply chamber 450 is much smaller than the return volume of the return chamber 452, and the supply chamber 450 is almost empty while the return chamber 452 is full of the used circulation fluid 22.

With the design illustrated in FIGS. 4A-4C, the system contains two storage containers so that if the piston is of not the same density as the liquid being pumped, then the pistons can move in opposite directions in such a way that the center of mass remains at the same location.

In another embodiment, instead of using a spring to actuate the piston, pressurized air can be used to actuate the piston and push the cooling fluid out of the supply chamber into another separate return chamber.

In yet another embodiment, instead of using a spring, the piston can be actuated electromagnetically by using a linear motor type arrangement and push the fluid out of the supply chamber. In this case the cooling fluid could come back to the other side of the piston. But in this case if the cooling fluid touches the motor then it has to be electrically non-conductive.

Figure 5:
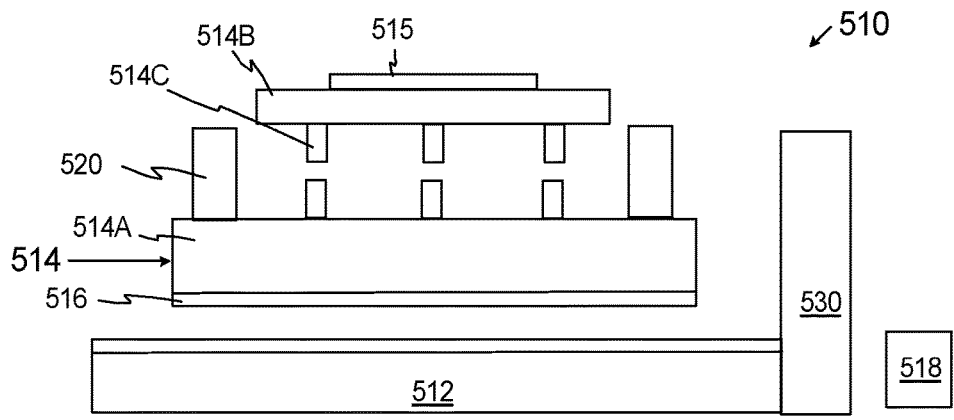
FIG. 5 is a simplified illustration of another embodiment of a stage assembly.

FIG. 5 is a simplified illustration of another embodiment of a stage assembly 510 that includes a base 512, a stage 514 that retains a device 515, a stage mover assembly 516 that moves the stage 514, a control system 518, a supply system assembly 520, and a recharging station 530. The base 512, the stage mover assembly 516, the control system 518, the supply system assembly 520, and the recharging station 530 can be somewhat similar to the corresponding components described above and illustrated in FIG. 1.

However, in this embodiment, the stage 514 is a two-part stage, with the upper section 514B being movable relative to the lower section 514A with an additional mover assembly 514C. For example, the additional mover assembly 514C can be controlled to move the upper section 514B relative to the lower section 514A with six degrees or less of freedom. As nonexclusive examples, the additional mover assembly 514C can include one or more planar, linear, voice coil, attraction only, or other types of actuators.

In this embodiment, the stage mover assembly 516 can be high precision and used to make adjustments to the position of the lower section 514A and the additional mover assembly 514C can be high precision and used to make fine adjustments to the position of the device 515 and the upper section 5148.

It should be noted that in FIG. 5, the supply system assembly 520 is secured to and moves with the lower section 514A. As a result thereof, the upper section 514B can be moved relative to the supply system assembly 520. In this embodiment, the additional mover assembly 514C can be used to compensate for slight disturbances caused by the flexible tubes and wires used to connect the supply system assembly 520 to the upper section 514B.

Figure 6:
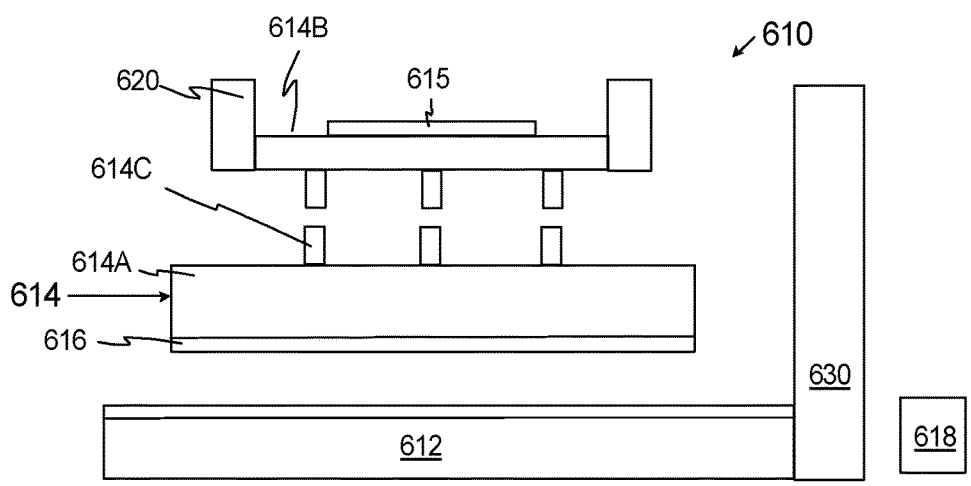
FIG. 6 is a simplified illustration of yet another embodiment of a stage assembly.

FIG. 6 is a simplified illustration of another embodiment of a stage assembly 610 that includes a base 612, a stage 614 that retains a device 615, a stage mover assembly 616 that moves the stage 614, a control system 618, a supply system assembly 620, and a recharging station 630. The base 612, the stage mover assembly 616, the control system 618, the supply system assembly 620, and the recharging station 630 can be somewhat similar to the corresponding components described above and illustrated in FIG. 1.

In FIG. 6, the stage 614 again is a two-part stage, with the upper section 614B being movable relative to the lower section 614A with the additional mover assembly 614C. However, in this embodiment, the supply system assembly 620 is secured to and moves with the upper section 614B.

Figure 7:
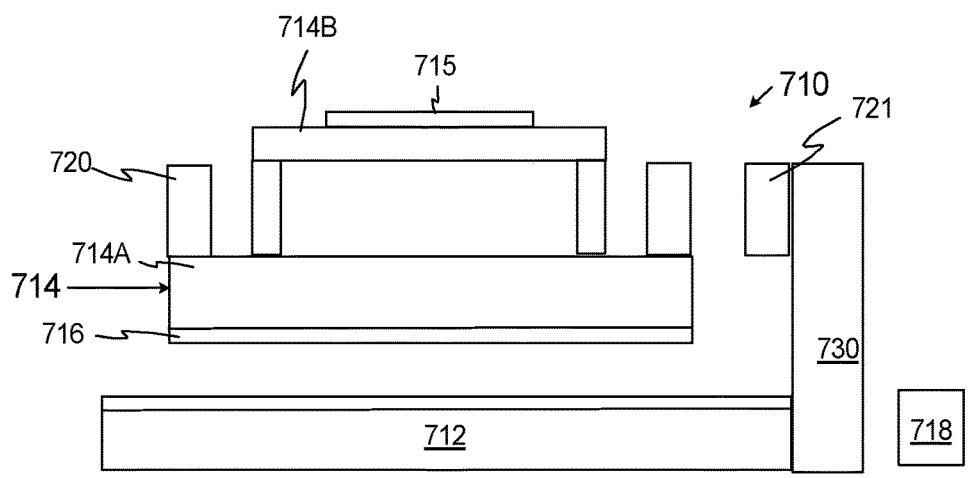
FIG. 7 is a simplified illustration of still another embodiment of a stage assembly.

FIG. 7 is a simplified illustration of yet another embodiment of a stage assembly 710 that includes a base 712, a stage 714 that retains a device 715, a stage mover assembly 716 that moves the stage 714, a control system 718, a supply system assembly 720, and a recharging station 730. The base 712, the stage mover assembly 716, and the control system 718 can be somewhat similar to the corresponding components described above and illustrated in FIG. 1. Further, in FIG. 7, the stage 714 is monolithic, with the upper section 7148 being fixedly secured to the lower section 714A.

However, in FIG. 7, the supply system assembly 720 is selectively removable from the stage 714 with the recharging station 730. With this design, instead of resupplying the supply system assembly 720, the recharging station 730 swaps out the supply system assembly 720 with a recharged supply system assembly 721.

Figure 8A:
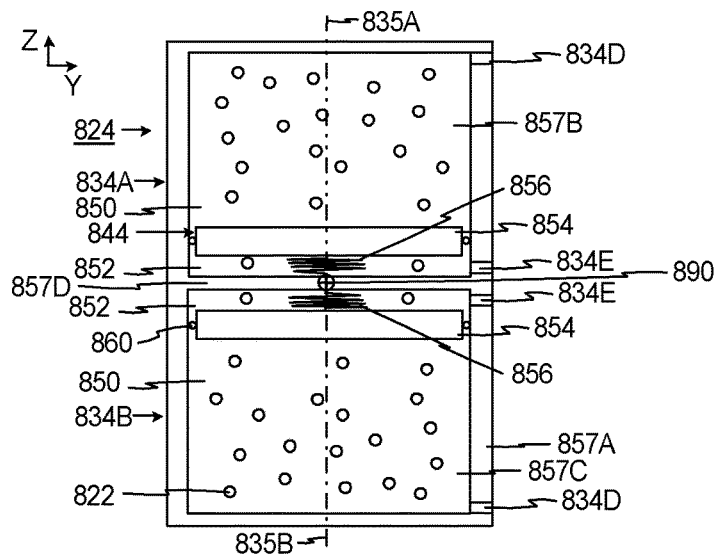
FIGS. 8A, 8B, and 8C are simplified illustrations of still another embodiment of a portion of the circulation system at alternative positions.
Figure 8B:
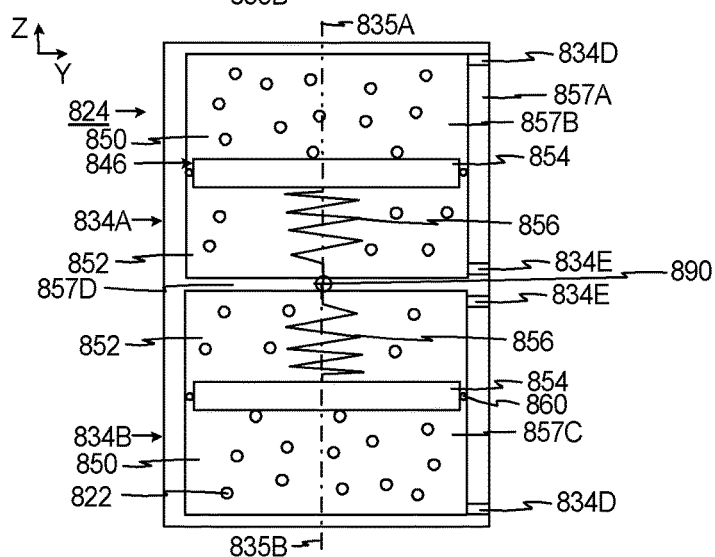
Figure 8C:
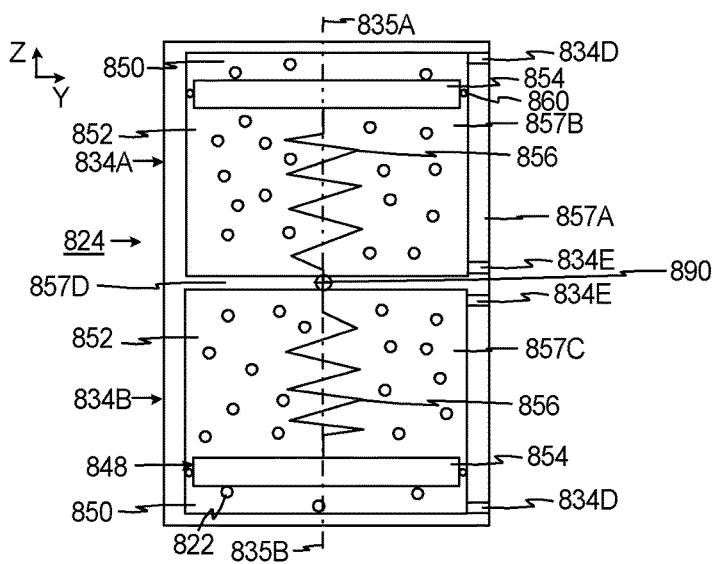

FIGS. 8A, 8B, 8C are simplified, cross-sectional, illustrations of yet another embodiment of a circulation system 824 of the supply system. In this embodiment, the circulation system 824 includes an upper, first storage container assembly 834A and a lower, second storage container assembly 834B. In this example, the two storage container assemblies 834A, 834B are illustrated at an approximately full position 844 in FIG. 8A, at an approximately half-full position 846 in FIG. 8B, and at an approximately empty position 848 in FIG. 8C. Alternatively, the circulation system 824 can be designed to include more than two storage container assemblies 834A, 834B.

In this embodiment, the first storage container assembly 834A is stacked on top of and is directly above the second storage container assembly 834B. More specifically, the first storage container assembly 834A includes a first container axis 835A (parallel to the Z axis), the second storage container assembly 834B includes a second container axis 835B (parallel to the Z axis), and the first storage container assembly 834A is stacked on the second storage container assembly 834B so that the container axes 835A, 835B are aligned and coaxial.

Further, in this embodiment, each storage container assembly 834A, 834B includes (i) a supply chamber 850, (ii) a return chamber 852, (iii) a movable piston 854 (or barrier) that separates the supply chamber 850 from the return chamber 852, and (iv) a piston urger 856 that urges the piston 854 to move to reduce the supply volume of the supply chamber 850 and urge the circulation fluid 822 out of the supply chamber 850. Stated in another fashion, each storage container assembly 834A, 834B defines a supply chamber 850 that supplies pressurized circulation fluid 822 to the circulation conduit 14D (illustrated in FIG. 1), and a return chamber 852 that receives the circulation fluid 822 that was circulated through the circulation conduit 14D.

With the present design, each storage container assembly 834A, 834B is a fluid pump in which the piston 854 and the piston urger 856 act as a pump that creates a pressure used to circulate the fluid 822 through the circulation conduit 14D. Further, during operation of the circulation system 824, a supply volume of the supply chamber 850 decreases and a return volume of the return chamber 852 increases concurrently. As non-exclusive examples, the piston urger 856 can be a resilient member, such as a spring or other type of device such as fluid bladder.

Moreover, in this embodiment, each supply chamber 850 includes a supply port 834D that is in fluid communication with the inlet to the circulation conduit 14D (illustrated in FIG. 1) or another housing; and each return chamber 452 includes a return port 434E that is in fluid communication with the outlet of the circulation conduit 14D or another housing. With this design, the circulation system 824 is a closed-circuit design in which the circulation fluid 822 is pushed out of the supply chambers 850 into the circulation conduit 14D and subsequently returns to the return chambers 852.

In FIGS. 8A-8C, the circulation system 824 includes a circulation housing 857A having a cylindrical-shaped, upper opening 857B that defines the first storage container assembly 834A, a cylindrical-shaped, lower opening 857C that defines the second storage container assembly 834B, and a disk-shaped separation wall 857D that separates the openings 857B, 857C. In this embodiment, the two storage container assemblies 834A, 834B share a common housing. Further, in this embodiment, each piston 854 is generally cylindrical-shaped and slides in the respective, cylindrical-shaped opening 857B, 857C. Further, each piston 854 can include a piston seal 860 that seals the side of the piston 854 to the circulation housing 857A. However, other shapes and designs can be utilized. For example, the two storage container assemblies 834A, 834B can have separate housings.

Additionally, the circulation system 824 can include a flow control assembly (not shown) that selectively controls a flow rate of the circulation fluid 822 from the supply chambers 850 to the circulation conduit 14D. With this design, the flow control assembly can selectively adjust a flow rate of the circulation fluid 822 that is directed to the circulation conduit 14D to maintain the desired temperature of the device 15. Further, this design saves space by making use of the same volume for both supply and return circulation fluid 822. Moreover, the pump does not need any other energy source other than the potential energy in the compressed springs 856. Additionally, the pistons 854 can keep the circulation fluid 822 completely confined without enclosing any air (or minimizing the amount of air). The spring-loaded partition inhibits the circulation fluid 822 from sloshing within the chambers 850, 852 when the stage 14 is accelerated or decelerated.

As provided above, FIG. 8A illustrates the storage container assemblies 834A, 834B at the full position 844. At this time, the flow control assembly inhibits flow of the circulation fluid 822 to the circulation conduit 14D and the supply chambers 850 are filled with fresh circulation fluid 22 at the appropriate temperature, and the return chamber 852 is empty or approximately empty.

Next, at the appropriate time, (e.g. just prior to or at the start of the exposure process), the flow control assembly opens to allow for flow of the circulation fluid 822 to the circulation conduit 14D. At this time, for the first storage container assembly 834A, the piston urger 856 urges the piston 854 (upward in the illustrated example) to force the circulation fluid 822 from the supply chamber 850; and, for the second storage container assembly 834B, the piston urger 856 urges the piston 854 (downward in the illustrated example) to force the circulation fluid 822 from the supply chamber 850. This process simultaneously reduces the supply volume of the supply chamber 850 while increasing the return volume of the return chamber 852. This causes the circulation fluid 822 to flow from the supply chambers 850 to the circulation conduit 14D and the used circulation fluid 822 to flow from the circulation conduit 14D to the return chambers 852.

FIG. 8B illustrates the storage container assemblies 834A, 834B at approximately the half-full position 846 during the circulation process. At this time, the piston urgers 856 are urging the pistons 854 away from each other to force the circulation fluid 822 from the supply chambers 850 thereby simultaneously reducing the supply volume of the supply chambers 850 while simultaneously increasing the return volume of the return chambers 852.

FIG. 8C illustrates the storage container assemblies 834A, 834B at the empty position 848 (or approximately empty) at, near or after the end of the exposure process. At this time, the flow control assembly inhibits flow of the circulation fluid 822 to the circulation conduit 14D, the pistons 854 have moved so that the supply volume of each supply chamber 850 is much smaller than the return volume of the return chamber 852, and the supply chambers 850 are almost empty while the return chambers 852 are full of the used circulation fluid 822.

With the design illustrated in FIGS. 8A-8C, the two storage container assemblies 834A, 834B are flipped, and the pistons 854 move equal distances, in opposite directions (away from each other along the container axes 835A, 835B) in such a way that a center of mass 890 (also referred to as a "center of gravity") of the circulation system 822 remains at the same location during operation. In this embodiment, the center of mass 890 is positioned between the storage container assemblies 834A, 834B along the container axes 835A, 835B. Thus, the problem of a variable center of gravity 890 location of a piston water pump 824 is solved by having two opposing pistons 854 that move equal (or approximately equal) distances in opposite directions within a partitioned water pump. The dual piston 854 design will inhibit the changing of the center of gravity 890 during operation. In FIGS. 8A-8C, the dual pistons 854 will move in equal and opposite directions along the container axes 835A, 835B to inhibit a change of location of the center of gravity 890.

In FIGS. 8A-8C, (i) for the first storage container assembly 834A, the supply chamber 850 is positioned above the return chamber 852; and (ii) for the second storage container assembly 834B, the supply chamber 850 is positioned below the return chamber 852. Alternatively, for the first storage container assembly 834A, the supply chamber 850 can be positioned below the return chamber 852, and for the second storage container assembly 834B, the supply chamber 850 can be positioned above the return chamber 852. In this design, the pistons 854 would move in opposite directions towards each other along the container axis 835 during operation.

Figure 9A:
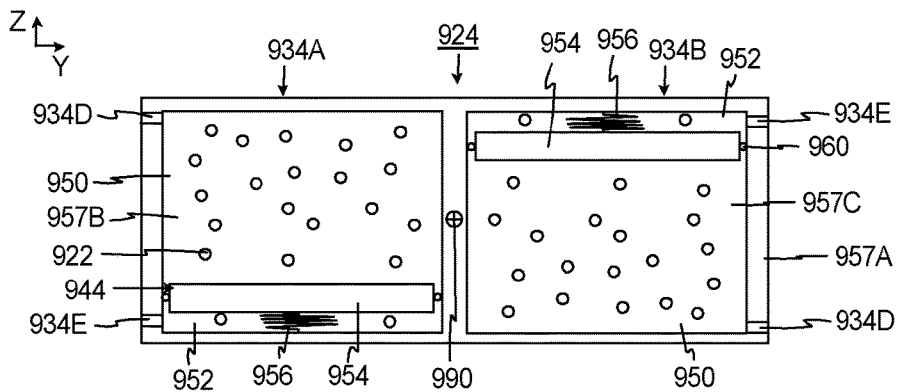
FIGS. 9A, 9B, and 9C are simplified illustrations of yet another embodiment of a portion of the circulation system at alternative positions.
Figure 9B:
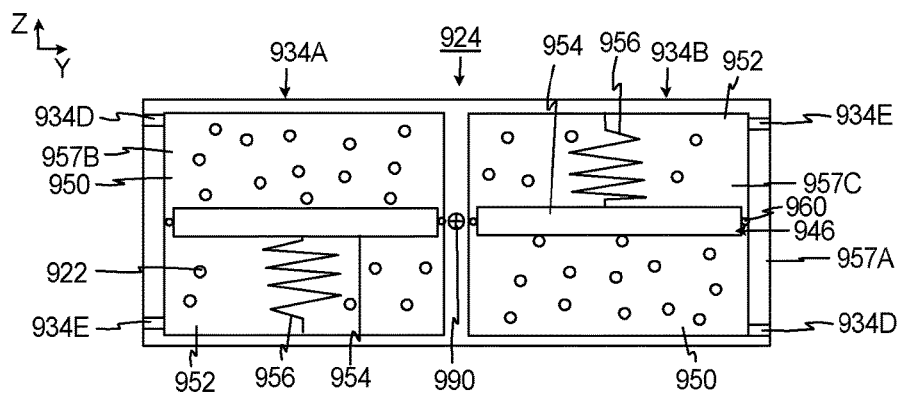
Figure 9C:
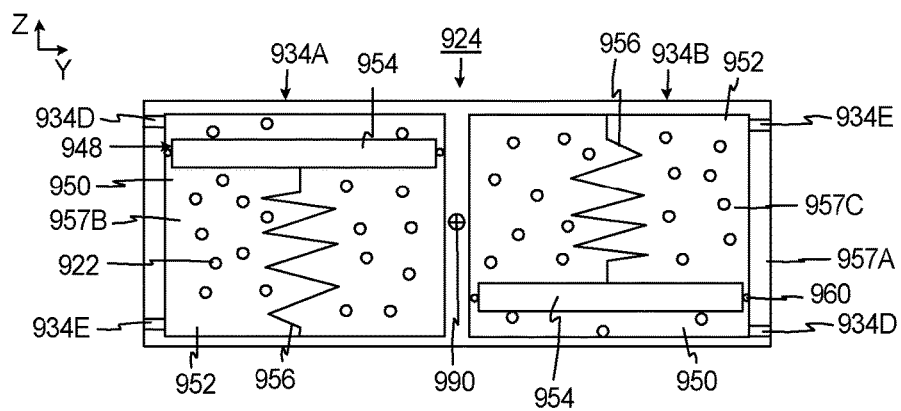

FIGS. 9A, 9B, 9C are simplified, cross-sectional, illustrations of still another embodiment of a circulation system 924 of the supply system. In this embodiment, the circulation system 924 again includes a first storage container assembly 934A and a second storage container assembly 934B that are similar to the corresponding components described above and illustrated in FIGS. 8A-8C. However, in this embodiment, the storage container assembly 934A, 934B are positioned side-by-side.

In this example, the two storage container assemblies 934A, 934B are illustrated at an approximately full position 944 in FIG. 9A, at an approximately half-full position 946 in FIG. 9B, and at an approximately empty position 948 in FIG. 9C. Alternatively, the circulation system 924 can be designed to include more than two storage container assemblies 934A, 934B.

In this embodiment, each storage container assembly 934A, 934B includes (i) a supply chamber 950, (ii) a return chamber 952, (iii) a movable piston 954 (or barrier) that separates the supply chamber 950 from the return chamber 952, and (iv) a piston urger 956 that urges the piston 954 to move to reduce the supply volume of the supply chamber 950 and urge the circulation fluid 922 out of the supply chamber 950.

Moreover, in this embodiment, each supply chamber 950 includes a supply port 934D that is in fluid communication with the inlet to the circulation conduit 14D (illustrated in FIG. 1); and each return chamber 952 includes a return port 934E that is in fluid communication with the outlet of the circulation conduit 14D. With this design, the circulation system 924 is a closed-circuit design in which the circulation fluid 922 is pushed out of the supply chambers 950 into the circulation conduit 14D and subsequently returns to the return chambers 952.

In FIGS. 9A-9C, the circulation system 924 includes a circulation housing 957A having a cylindrical-shaped, left opening 957B that defines the first storage container assembly 934A, and a cylindrical-shaped, right opening 957C that defines the second storage container assembly 934B. In this embodiment, the two storage container assemblies 934A, 934B share a common housing. Further, in this embodiment, each piston 954 is generally cylindrical-shaped and slides in the respective, cylindrical-shaped opening 957B, 957C. Further, each piston 954 can include a piston seal 960 that seals the side of the piston 954 to the circulation housing 957A.

However, other shapes and designs can be utilized. For example, the two storage container assemblies 934A, 934B can have separate housings.

As provided above, FIG. 9A illustrates the storage container assemblies 934A, 934B at the full position 944. At this time, the flow control assembly (not shown) inhibits flow of the circulation fluid 922 to the circulation conduit 14D and the supply chambers 950 are filled with fresh circulation fluid 22 at the appropriate temperature, and the return chamber 952 is empty or approximately empty.

Next, at the appropriate time, (e.g. just prior to or at the start of the exposure process), the flow control assembly opens to allow for flow of the circulation fluid 922 to the circulation conduit 14D. At this time, for the first storage container assembly 934A, the piston urger 956 urges the piston 954 (upward in the illustrated example) to force the circulation fluid 922 from the supply chamber 950; and, for the second storage container assembly 934B, the piston urger 956 urges the piston 954 (downward in the illustrated example) to force the circulation fluid 922 from the supply chamber 950. This process simultaneously reducing the supply volume of the supply chambers 950 while increasing the return volume of the return chambers 952. This causes the circulation fluid 922 to flow from the supply chambers 950 to the circulation conduit 14D and the used circulation fluid 922 to flow from the circulation conduit 14D to the return chambers 952.

FIG. 9B illustrates the storage container assemblies 934A, 934B at approximately the half-full position 946 during the circulation process. At this time, the piston urgers 956 are urging the pistons 954 in opposite directions to force the circulation fluid 922 from the supply chambers 950 thereby simultaneously reducing the supply volume of the supply chambers 950 while simultaneously increasing the return volume of the return chambers 952.

FIG. 9C illustrates the storage container assemblies 934A, 934B at the empty position 948 (or approximately empty) at, near or after the end of the exposure process. At this time, the flow control assembly inhibits flow of the circulation fluid 922 to the circulation conduit 14D, the pistons 954 have moved so that the supply volume of each supply chamber 950 is much smaller than the return volume of the return chamber 952, and the supply chambers 950 are almost empty while the return chambers 952 are full of the used circulation fluid 922.

With the design illustrated in FIGS. 9A-9C, the two storage container assemblies 934A, 934B are flipped, and the pistons 954 move equal (or approximately equal) distances, in opposite directions in such a way that a center of mass 990 (also referred to as a "center of gravity") of the circulation system 922 remains at the same location during operation. Thus, the problem of a variable center of gravity 990 location of a piston water pump 924 is solved by having two opposing pistons 954 that move equal distances in opposite directions within a partitioned water pump. The dual piston 954 design will inhibit the changing of the center of gravity 990 during operation. The dual pistons 954 will move in equal and opposite directions which prevents change of location of the center of gravity 990.

In FIGS. 9A-9C, (i) for the first storage container assembly 934A, the supply chamber 950 is above the return chamber 952; and (ii) for the second storage container assembly 934B, the supply chamber 950 is below the return chamber 952. Alternatively, for the first storage container assembly 934A, the supply chamber 950 can be below the return chamber 952, and for the second storage container assembly 934B, the supply chamber 950 can be above the return chamber 952.

Figure 10:
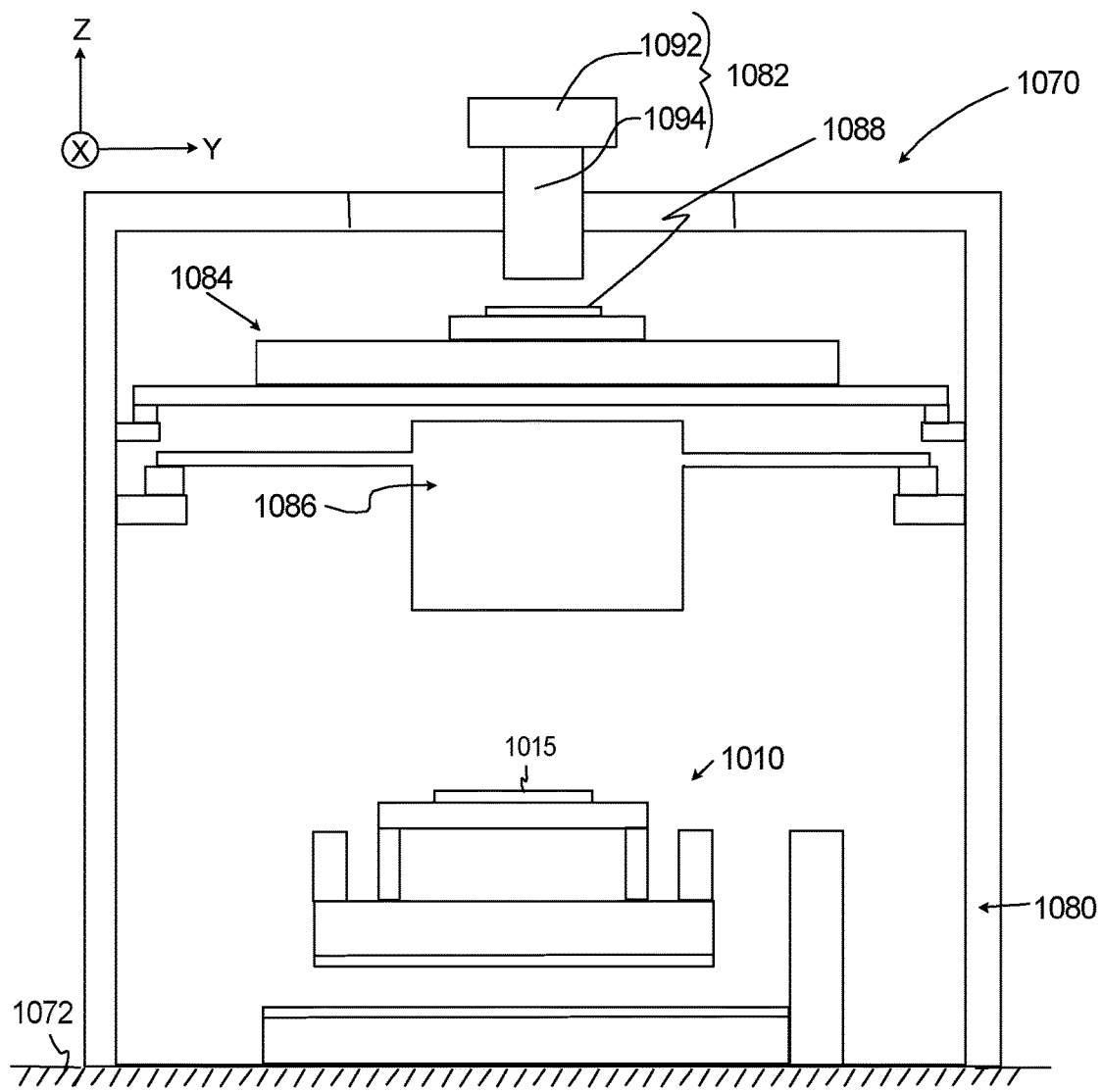
FIG. 10 is a schematic illustration of an exposure apparatus having features of the present invention.

FIG. 10 is a schematic view illustrating an exposure apparatus 1070 useful with the present invention. The exposure apparatus 1070 includes the apparatus frame 1080, an illumination system 1082 (irradiation apparatus), a reticle stage assembly 1084, an optical assembly 1086 (lens assembly), and a wafer stage assembly 1010. The stage assemblies provided herein can be used as the wafer stage assembly 1010. Alternately, with the disclosure provided herein, the stage assemblies provided herein can be modified for use as the reticle stage assembly 1084. The exposure apparatus 1070 can be an immersion system with an immersion fluid between the optical assembly 1086 and the wafer 1015.

The exposure apparatus 1070 is particularly useful as a lithographic device that transfers a pattern (not shown) of an integrated circuit from a reticle 1088 onto the semiconductor wafer 1015. The exposure apparatus 1070 mounts to the mounting base 1072, e.g., the ground, a base, or floor or some other supporting structure.

The apparatus frame 1080 is rigid and supports the components of the exposure apparatus 1070. The design of the apparatus frame 1080 can be varied to suit the design requirements for the rest of the exposure apparatus 1070.

The illumination system 1082 includes an illumination source 1092 and an illumination optical assembly 1094. The illumination source 1092 emits a beam (irradiation) of light energy. The illumination optical assembly 1094 guides the beam of light energy from the illumination source 1092 to the optical assembly 1086. The beam illuminates selectively different portions of the reticle 1088 and exposes the semiconductor wafer 1015. In FIG. 10, the illumination source 1092 is illustrated as being supported above the reticle stage assembly 1084. Alternatively, the illumination source 1092 can be secured to one of the sides of the apparatus frame 1080 and the energy beam from the illumination source 1092 is directed to above the reticle stage assembly 1084 with the illumination optical assembly 1094.

The optical assembly 1086 projects and/or focuses the light passing through the reticle to the wafer. Depending upon the design of the exposure apparatus 1070, the optical assembly 1086 can magnify or reduce the image illuminated on the reticle.

The reticle stage assembly 1084 holds and positions the reticle 1088 relative to the optical assembly 1086 and the wafer 1015. Similarly, the wafer stage assembly 1010 holds and positions the wafer 1015 with respect to the projected image of the illuminated portions of the reticle 1088.

There are a number of different types of lithographic devices. For example, the exposure apparatus 1070 can be used as scanning type photolithography system that exposes the pattern from the reticle 1088 onto the wafer 1015 with the reticle 1088 and the wafer 1015 moving synchronously. Alternatively, the exposure apparatus 1070 can be a step-and-repeat type photolithography system that exposes the reticle 1088 while the reticle 1088 and the wafer 1015 are stationary.

However, the use of the exposure apparatus 1070 and the stage assemblies provided herein are not limited to a photolithography system for semiconductor manufacturing. The exposure apparatus 1070, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 11A:
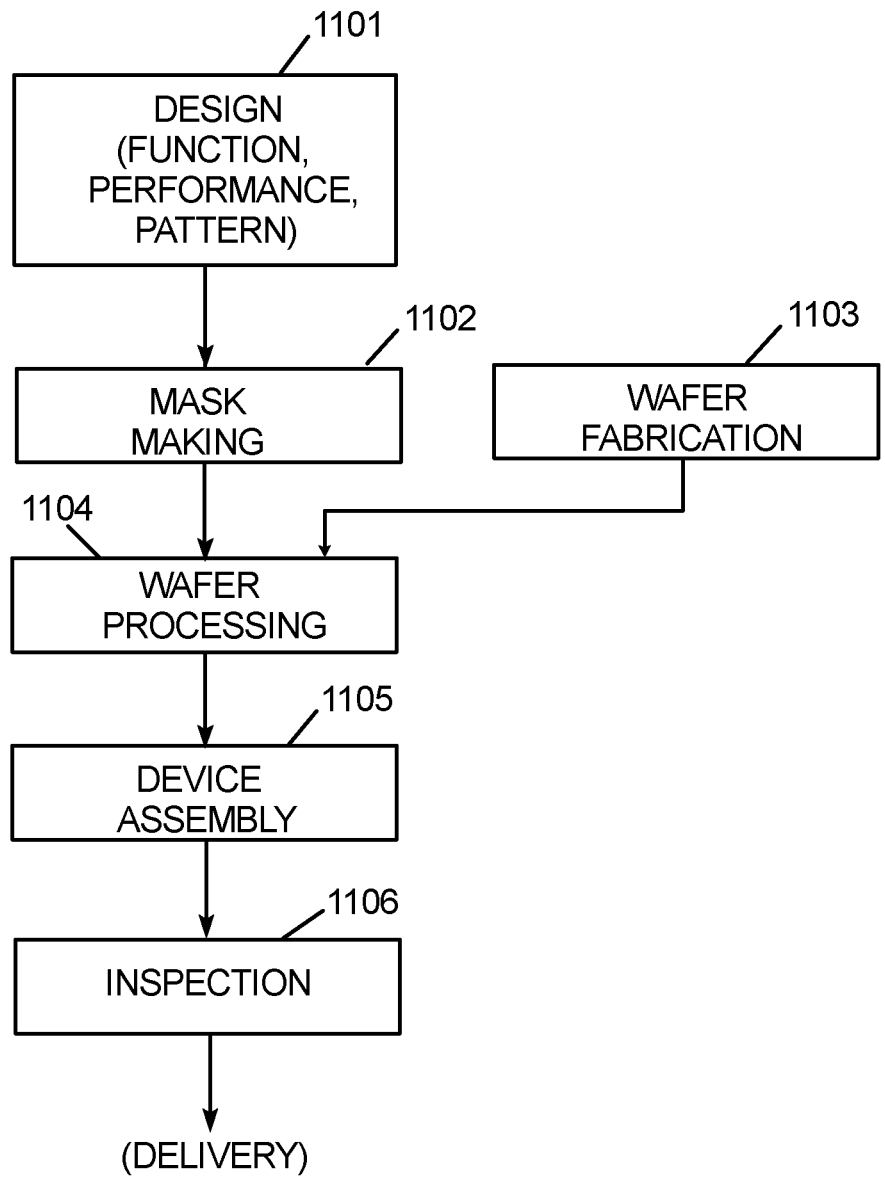
FIG. 11A is a flow chart that outlines a process for manufacturing a device in accordance with the present invention.

Further, semiconductor devices can be fabricated using the above described systems, by the process shown generally in FIG. 11A. In step 1101 the device's function and performance characteristics are designed. Next, in step 1102, a mask (reticle) having a pattern is designed according to the previous designing step, and in a parallel step 1103 a wafer is made from a silicon material. The mask pattern designed in step 1102 is exposed onto the wafer from step 1103 in step 1104 by a photolithography system described hereinabove in accordance with the present invention. In step 1105 the semiconductor device is assembled (including the dicing process, bonding process and packaging process), finally, the device is then inspected in step 1106.

Figure 11B:
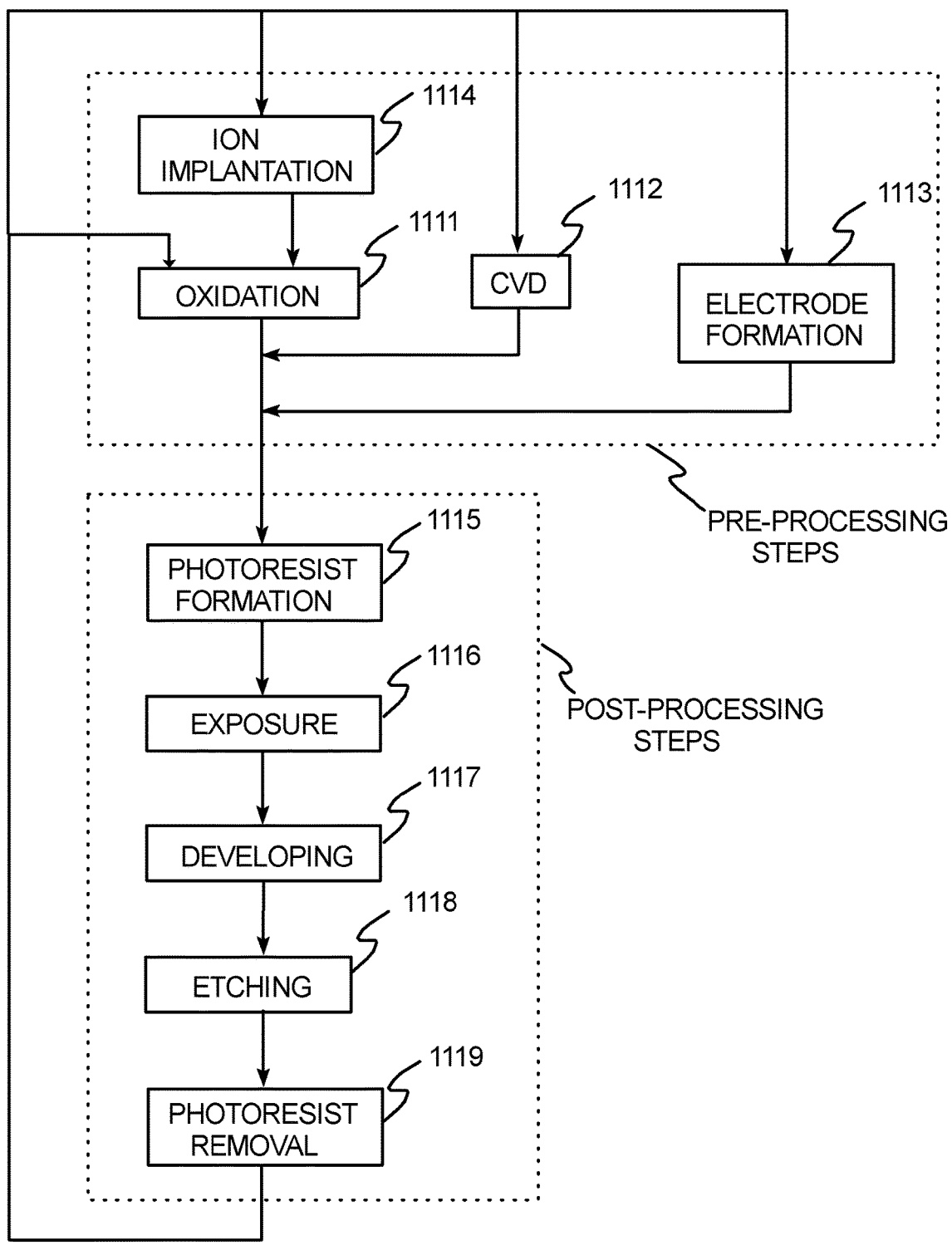
FIG. 11B is a flow chart that outlines device processing in more detail.

FIG. 11B illustrates a detailed flowchart example of the above-mentioned step 1104 in the case of fabricating semiconductor devices. In FIG. 11B, in step 1111 (oxidation step), the wafer surface is oxidized. In step 1112 (CVD step), an insulation film is formed on the wafer surface. In step 1113 (electrode formation step), electrodes are formed on the wafer by vapor deposition. In step 1114 (ion implantation step), ions are implanted in the wafer. The above mentioned steps 1111-1114 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1115 (photoresist formation step), photoresist is applied to a wafer. Next, in step 1116 (exposure step), the above-mentioned exposure device is used to transfer the circuit pattern of a mask (reticle) to a wafer. Then in step 1117 (developing step), the exposed wafer is developed, and in step 1118 (etching step), parts other than residual photoresist (exposed material surface) are removed by etching. In step 1119 (photoresist removal step), unnecessary photoresist remaining after etching is removed.

Multiple circuit patterns are formed by repetition of these preprocessing and post-processing steps.

While the particular stage assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device, the stage assembly comprising:
a stage that is adapted to retain the device, the stage including a circulation conduit;
a base;
a stage mover assembly that moves the stage relative to the base, the stage mover assembly including a magnet assembly, and a conductor assembly; wherein one of the assemblies is coupled to the stage, and the other of the assemblies is coupled to the base; and
a supply system that is secured to and positioned on the stage, the supply system including a circulation system that circulates a circulation fluid through the circulation conduit on the stage; wherein the circulation system includes an inlet that supplies the circulation fluid to the circulation conduit, and an outlet that receives the circulation fluid that was circulated through the circulation conduit.

2. The stage assembly of claim 1 wherein the circulation system includes a storage container assembly that defines a supply chamber that supplies pressurized, circulation fluid to the circulation conduit, and a return chamber that receives the circulation fluid that was circulated through the circulation conduit.

3. The stage assembly of claim 2 wherein during operation of the circulation system, a supply volume of the supply chamber decreases and a return volume of the return chamber increases concurrently.

4. The stage assembly of claim 3 wherein the storage container assembly includes a movable piston that separates the supply chamber from the return chamber, and a resilient member that urges the movable piston to move to reduce the supply volume of the supply chamber and urge the circulation fluid out of the supply chamber.

5. The stage assembly of claim 4 wherein the circulation fluid urged from the supply chamber by the movable piston and the resilient member returns to the return chamber.

6. The stage assembly of claim 4 wherein the movable piston has approximately the same density as the circulation fluid.

7. The stage assembly of claim 2 wherein the circulation system includes a flow control assembly that selectively controls a flow rate of the circulation fluid from the supply chamber to the circulation conduit.

8. The stage assembly of claim 1 wherein the supply system includes a vacuum supply that supplies a vacuum to a chuck on the stage that retains the device, and a power source that provides electrical power to the stage.

9. The stage assembly of claim 8 further comprising a recharging station which selectively recharges the circulation system, the vacuum supply, and the power source while the supply system is on the stage.

10. The stage assembly of claim 1 wherein the supply system is removable from the stage and swappable to recharge the circulation system.

11. The stage assembly of claim 1 wherein the stage includes a coarse stage and a fine stage that is movable relative to the coarse stage, and wherein the supply system is secured to one of the fine stage and the coarse stage.

12. The stage assembly of claim 1 wherein the storage container assembly further includes a movable piston that separates the supply chamber from the return chamber; and wherein the circulation system further includes a second storage container assembly that defines a supply chamber that supplies a pressurized, second portion of the circulation fluid to the circulation conduit, a return chamber that receives the second portion of the circulation fluid that was circulated through the circulation conduit, and a movable piston that separates the supply chamber from the return chamber; wherein the movable piston of the storage container assembly moves in an opposite direction from the movable piston of the second storage container assembly while the circulation fluid is supplied to the circulation conduit so that a center of mass remains at approximately the same location.

13. An exposure apparatus comprising an illumination system and the stage assembly of claim 1.

14. The stage assembly of claim 1 wherein the circulation fluid is a cooling fluid.

15. A stage assembly that moves a device, the stage assembly comprising:
   a stage that is adapted to retain the device the stage including a circulation conduit;
   a base;
   a stage mover assembly that moves the stage relative to the base, the stage mover assembly including a magnet assembly, and a conductor assembly; wherein one of the assemblies is coupled to the stage, and the other of the assemblies is coupled to the base; and
   a supply system that is secured to and positioned on the stage, the supply system including a circulation system that circulates a circulation fluid through the circulation conduit on the stage; and wherein the supply system includes a storage container assembly that defines a supply chamber that supplies pressurized circulation fluid to the circulation conduit, and a movable piston that is positioned in the storage container assembly; wherein pressurized air is used to actuate the movable piston and push the circulation fluid out of the supply chamber.

16. A stage assembly that moves a device, the stage assembly comprising:
   a stage that is adapted to retain the device, the stage including a circulation conduit;
   a base;
   a stage mover assembly that moves the stage relative to the base, the stage mover assembly including a magnet assembly, and a conductor assembly; wherein one of the assemblies is coupled to the stage, and the other of the assemblies is coupled to the base; and
   a supply system that is secured to and positioned on the stage, the supply system including a circulation system that circulates a circulation fluid through the circulation conduit on the stage; and wherein the supply system includes a storage container assembly that defines a supply chamber that supplies pressurized circulation fluid to the circulation conduit, and a movable piston that is positioned in the storage container assembly; wherein the movable piston is electromagnetically actuated to move the movable piston and push the circulation fluid out of the supply chamber.

17. A supply system that supplies pressurized, circulation fluid to a circulation conduit, the supply system comprising:
   (i) a first storage container assembly that defines a supply chamber that supplies a first portion of the circulation fluid to the circulation conduit, a return chamber that receives the first portion of the circulation fluid that was circulated through the circulation conduit, and a movable piston that separates the supply chamber from the return chamber; and
   (ii) a second storage container assembly that defines a supply chamber that supplies a second portion of the circulation fluid to the circulation conduit, a return chamber that receives the second portion of the circulation fluid that was circulated through the circulation conduit, and a movable piston that separates the supply chamber from the return chamber;
   wherein the movable piston of the first storage container assembly in an opposite direction from the movable piston of the second storage container assembly while the pressurized circulation fluid is supplied to the circulation conduit so that a center of mass of the supply system remains at approximately the same location.

18. The supply system of claim 17 wherein the first storage container assembly is stacked on top of the second storage container assembly.

19. The supply system of claim 17 wherein the center of mass is positioned between the first storage container assembly and the second storage container assembly.

20. The supply system of claim 17 wherein the first storage container assembly and the second storage container assembly are positioned side-by-side.

21. A supply system that supplies pressurized, circulation fluid to a circulation conduit, the supply system comprising:
   (i) a first storage container assembly that defines a supply chamber that supplies a first portion of the circulation fluid to the circulation conduit, a return chamber that receives the first portion of the circulation fluid that was circulated through the circulation conduit, and a movable piston that separates the supply chamber from the return chamber; and
   (ii) a second storage container assembly that defines a supply chamber that supplies a second portion of the circulation fluid to the circulation conduit, a return chamber that receives the second portion of the circulation fluid that was circulated through the circulation conduit, and a movable piston that separates the supply chamber from the return chamber;
   wherein the movable piston of the first storage container assembly moves in an opposite direction from the movable piston of the second storage container assembly while the pressurized circulation fluid is supplied to the circulation conduit so that a center of mass of the supply system remains at approximately the same location; and
   wherein the first storage container assembly includes a first container central axis and the second storage container assembly includes a second container central axis, and wherein the first container central axis is aligned with the second container central axis.

22. A stage assembly that moves a device, the stage assembly comprising:
   a stage that is adapted to retain the device, the stage including a circulation conduit;
   a base;
   a stage mover assembly that moves the stage relative to the base, the stage mover assembly including a magnet assembly, and a conductor assembly; wherein one of the assemblies is coupled to the stage, and the other of the assemblies is coupled to the base; and a supply system that is secured to and positioned on the stage, the supply system including a circulation system that circulates a circulation fluid through the circulation conduit on the stage; wherein the supply system is removable from the stage and swappable to recharge the circulation system.

* * * * *

UNITED STATES PATENT AND TRADEMARK OFFICE
CERTIFICATE OF CORRECTION

PATENT NO. : 9,904,178 B2
APPLICATION NO. : 15/094480
DATED : February 27, 2018
INVENTOR(S) : Chetan Mahadeswaraswamy et al.

Page 1 of 1

It is certified that error appears in the above-identified patent and that said Letters Patent is hereby corrected as shown below:

In the Claims

Column 22, Line 16, Claim 17 insert --is controlled to move-- after "assembly".

Signed and Sealed this
Twelfth Day of June, 2018

Andrei Iancu
*Director of the United States Patent and Trademark Office*